United States Patent
Long et al.

(10) Patent No.: US 6,304,423 B1
(45) Date of Patent: Oct. 16, 2001

(54) INPUT PROTECTION CIRCUIT FOR A SEMICONDUCTOR DEVICE

(75) Inventors: Jerral Alan Long; Scott Birk Kesler; Michael Joseph Huemmer, all of Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/327,741

(22) Filed: Jun. 8, 1999

(51) Int. Cl.[7] ........................................... H02H 3/22
(52) U.S. Cl. ........................ 361/111; 361/56; 361/58; 361/91.1; 361/91.2; 361/91.5; 361/118; 257/362
(58) Field of Search ............................. 361/56, 58, 111, 361/118, 91.1, 91.2, 91.5; 257/362

(56) References Cited

U.S. PATENT DOCUMENTS

| | | | |
|---|---|---|---|
| 3,816,762 | * | 6/1974 | Holt ...................................... 307/237 |
| 4,994,874 | * | 2/1991 | Shimizu et al. .................... 357/23.13 |
| 5,158,899 | * | 10/1992 | Yamagata ................................ 437/27 |
| 5,235,489 | * | 8/1993 | Iannuzo .................................. 361/56 |
| 5,594,265 | * | 1/1997 | Shimizu et al. ....................... 257/355 |
| 5,781,047 |   | 7/1998 | Shreve .................................. 327/110 |
| 5,903,424 | * | 5/1999 | Tailliet .................................. 361/111 |
| 5,949,109 | * | 9/1999 | Shimizu et al. ....................... 257/355 |
| 6,028,338 | * | 2/2000 | Saito et al. ............................ 257/360 |

\* cited by examiner

Primary Examiner—Josie Ballato
Assistant Examiner—M Quinones
(74) Attorney, Agent, or Firm—Jimmy L. Funke

(57) ABSTRACT

A transient protection circuit (14) includes a resistor (22) having a first end adapted for connection to a first signal line (16) of a voltage supply (12) and a second opposite end connected to a voltage supply input (20) of an application circuit (18). In one embodiment, the resistor (22) defines an emitter (26) of a PNP transistor (24) having a floating base (28) and a collector (30) adapted for connection to a reference signal line (15) of the voltage supply (12). In an alternative embodiment (14'), the emitter (26) of the PNP transistor (24) is connected to the first end of the resistor (22). The transient protection circuit (14, 14') is preferably formed on a monolithic integrated circuit including the application circuit (18) wherein a semiconductor layer (46) defining the first input to the resistor (22) also defines a bond pad (50). The corners of the semiconductor layer (46) including those of the bond pad (50) are configured to equalize the electric field about the entire outer periphery of the semiconductor layer (46). The transient protection circuit (14, 14') is operable to protect the application circuit (18) from transient and other fault conditions associated with the voltage supply (12) including transient voltage spikes, load dump conditions, electrostatic discharge (ESD) events, reverse battery conditions and discharge events from an ignition coil secondary.

20 Claims, 3 Drawing Sheets

INPUT PROTECTION CIRCUIT FOR A SEMICONDUCTOR DEVICE

TECHNICAL FIELD

The present invention relates generally to transient protection circuits, and more specifically to such circuits operable to protect application circuitry from transients and other fault conditions associated with a voltage supply.

BACKGROUND OF THE INVENTION

In the past few decades, the automotive industry has striven to expand both the number and type of vehicular functions and systems subject to computer control. Due in part to the proliferation of such computer control, however, available physical space within a vehicle has correspondingly diminished, thereby resulting in a demand for more compact control systems. At the same time, owing both to the competitive climate within the industry and to the crucial nature of some of the vehicular functions under computer control, the overall reliability of such control systems has risen to the level of paramount importance.

As an example of one such system subject to computer control, a modern automotive ignition system typically includes an ignition coil and a coil current switching device responsive to an ignition, or "drive", signal to energize the ignition coil. Some type of control circuitry, responsive to microprocessor control, provides a drive signal to the coil current switching device to thereby energize the primary side of the ignition coil.

Typical prior art automotive ignition system have incorporated the control circuitry and coil current switching device into a single ignition module using a combination of integrated circuits and passive discrete components. This combination of components has been implemented using so-called hybrid electronics technology. Essentially, hybrid electronics is an amalgamation of integrated circuit technology and discrete electronic component technology arranged and surface mounted on a ceramic substrate such as, for example, alumina.

Hybrid ignition modules have been well received in the automotive industry, but they suffer from several inherent drawbacks. First, due simply to the number and size of discrete and integrated components required for operation, the overall size of an ignition module can be quite large as compared to a typical packaged integrated circuit. This problem is compounded by limitations inherent in hybrid processing technology such as large conductor line widths and conductor routing limitations. The size and number of componentary further adds to the overall weight of the module which, as the number of such vehicular control systems increases, can become a significant factor in system design. Second, such hybrid modules are typically expensive to produce, particularly when compared to processing costs associated with comparably complex integrated circuits. Further, because of the number of module components and interconnections therebetween, module reliability can be significantly less than that of comparably complex integrated circuits.

Designers of automotive ignition modules have attempted to overcome the foregoing drawbacks inherent in hybrid technology by designing so-called "all silicon" ignition coil driver modules. Such circuits use only integrated circuits and no passive discrete components. Prior art implementations of all silicon ignition coil driver modules typically derive their power from the control signal provided by an engine control computer or other microprocessor-based control computer. For example, when the computer-generated control signal transitions to an "on" state, the voltage provided to the ignition coil driver module energizes its circuitry and turns on the coil primary current. Conversely, when the computer-generated control signal transitions to an "off" state, the voltage removed from the ignition coil driver module deenergizes its circuitry and turns off the coil primary current which, in turn, generates an ignition spark. This type of system mechanisation eliminates the need for a connection from the ignition coil driver module to the vehicle battery, and an example of a system employing this concept is described in U.S. Pat. No. 5,781,047 to John R. Shreve et al., which is assigned to the assignee of the present invention, and the contents of which are incorporated herein by reference.

Implementations of all silicon ignition coil driver modules that are powered from a control computer have several drawbacks associated therewith. For example, such systems are only suitable for limited function ignition systems. Any ignition function that requires the module to be powered after the coil current has been turned off cannot be implemented in this manner. As another example, powering the ignition coil driver module from a control computer places additional demands on the computer's output circuitry to provide the needed voltage and current required by the ignition coil driver module.

To overcome the foregoing limitations, an all silicon ignition coil driver module is needed wherein such a module is powered from an independent power source, such as for example, the vehicle battery. In such a system, however, care must be taken to protect the integrated circuit from transient and other fault conditions typically associated with an external voltage supply. Throughout the automotive industry, for example, integrated circuitry having battery voltage supply inputs thereto are typically subject to specified voltage transient requirements. One such requirement is referred to "reverse battery" wherein the battery's polarity is reversed and the normally positive voltage supply input of the ignition coil driver circuitry is made negative, and the normally negative voltage supply input (e.g., ground) is made positive. A test for this requirement is typically performed with the equivalent of fully charged 12-volt automotive battery. The ignition coil driver circuitry must survive this test without overheating to the point of destruction or drawing such a large current that its interconnect wiring is fused open. Another voltage transient requirement is commonly referred to as a "load dump" wherein a large positive voltage ranging typically between 40–80 volts is applied to the voltage supply input of the ignition coil driver circuitry. As with the reversed battery requirement, the ignition coil driver circuitry must survive the load dump test without overheating to the point of destruction or drawing such a large current that its interconnect wiring is fused open. Yet another voltage transient requirement is that the voltage supply input of the ignition coil driver circuitry must be robust to electrostatic discharge (ESD) up to +/−25 kV using the commonly specified human body model (HBM). Yet another voltage transient requirement is that the voltage supply input of the ignition coil driver circuitry must be robust to an arc from the secondary of the ignition coil itself. Although the voltage arc requirement is similar to the ESD requirement, the energy is substantially higher.

What is therefore needed is a transient protection circuit that is operable to satisfy each of the foregoing voltage transient requirements, yet is small and simple enough in structure to be integrated into an application specific monolithic integrated circuit.

SUMMARY OF THE INVENTION

The present invention addresses the foregoing shortcomings in known transient protection circuits. In accordance with one aspect of the present invention, a transient protection circuit comprises a resistor having a first end adapted for connection to a first signal line of a voltage source and a second opposite end adapted for connection to a voltage supply input of an application circuit, and a bipolar transistor having an emitter connected to the first end of the resistor, a base, and a collector adapted for connection to a second signal line of the voltage supply.

In accordance with another aspect of the present invention, A transient protection circuit comprises a P-type semiconductor substrate adapted for connection to a first signal line of a voltage source, a N-type semiconductor well extending from the substrate, and a P-type semiconductor well disposed within the N-type well, wherein the P-type semiconductor well, the N-type semiconductor well and the P-type substrate define a bipolar transistor. A first electrical contact is made to the P-type semiconductor well and is adapted for connection to a second signal line of a voltage source, and a second electrical contact is made to the P-type semiconductor well and is adapted for connection to a voltage supply input of an application circuit, wherein the P-type semiconductor well defines a resistor between the first and second electrical contacts.

In accordance with a further aspect of the present invention, a transient protection circuit comprises a P-type semiconductor substrate adapted for connection to a first signal line of a voltage source, a N-type semiconductor well extending from the substrate, a first P-type semiconductor well disposed within the N-type well, wherein the first P-type semiconductor well, the N-type semiconductor well and the P-type substrate define a bipolar transistor, and the P-type semiconductor well defines a first electrical contact thereto. A second P-type semiconductor well is disposed within the N-type well, wherein the second P-type semiconductor well defines second and third electrical contacts thereto and a resistor therebetween. The first and second electrical contacts are adapted for connection to a second signal line of the voltage source, and the third electrical contact is adapted for connection to a voltage supply input of an application circuit.

One object of the present invention is to provide an improved transient protection circuit.

Another object of the present invention is to provide such a circuit operable to protect an application circuit from transient and other fault conditions associated with a voltage supply input signal.

Yet another object of the present invention is to provide such a circuit that may be formed on a monolithic integrated circuit with minimal circuit area consumption.

Still another object of the present invention is to provide such a circuit that is configured for substantially uniform electric field generation about a periphery thereof.

These and other objects of the present invention will become more apparent from the following description of the preferred embodiments.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
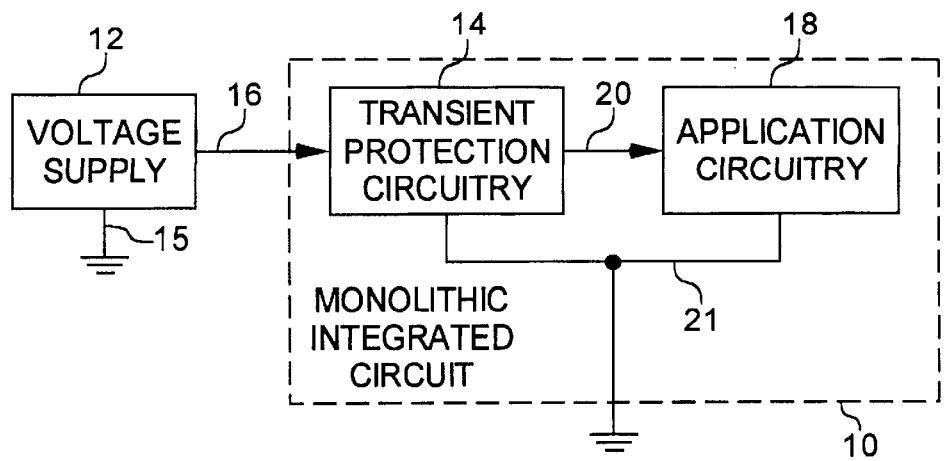
FIG. 1 is a block diagram illustration of an electronic circuit arrangement using the transient protection circuitry of the present invention.

Referring now to FIG. 1, one preferred embodiment of an electronic circuit arrangement utilizing the transient protection circuitry 14 of the present invention, is shown. The dashed-line box 10 illustrates a monolithic integrated circuit having a voltage supply input electrically connected to a voltage signal output of a voltage supply 12 via signal path 16. A second voltage signal line 15 of voltage supply 12 is preferably connected to a reference potential. In one preferred embodiment, voltage supply 12 is an automotive battery operable to produce a DC voltage of approximately 12.0 volts, and signal path 15 is preferably connected to ground reference. It is to be understood, however, that the present invention contemplates that voltage supply 12 may attentively be some other known voltage source including an external power supply, external voltage-generating circuitry, or the like, and that signal line 15 may alternatively be connected to some reference potential other than ground potential. In any case, the voltage supply signal on signal line 16 is received by the transient protection circuitry 14 of the present invention, and a voltage supply output of transient protection circuitry 14 is connected to a voltage supply input of an application circuit 18 via signal path 20. Preferably, the transient protection circuitry 14 and application circuitry 18 are both referenced to the same reference potential as signal line 15 of voltage supply 12, as shown by signal line 21 of FIG. 1. In one preferred embodiment, application circuitry 18 is an automotive ignition control circuit, although the present invention contemplates that application circuitry 18 may be any electrical circuit deriving its supply voltage from voltage supply 12.

Preferably, the transient protection circuitry 14 of the present invention and the application circuitry 18 are formed on a common monolithic integrated circuit 10 in accordance with one or more known integrated circuit fabrications techniques. It is to be understood, however, that the transient protection circuitry 14 of the present invention may alternatively be provided as a separate integrated circuit or as discrete electronic componentry.

Figure 2:
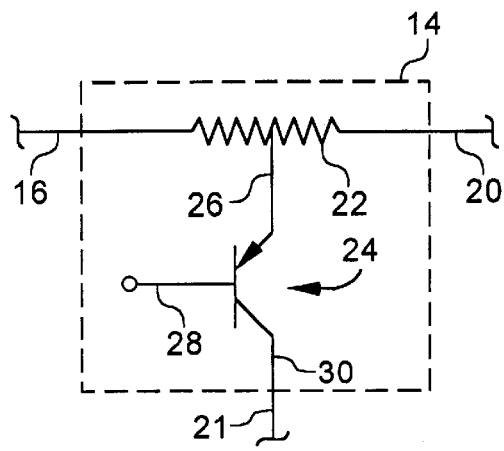
FIG. 2 is a device-level schematic illustrating one preferred embodiment of the transient protection circuitry of the present invention.

Referring now to FIG. 2, one preferred device-level embodiment of the transient protection circuitry 14 of FIG. 1, in accordance with the present invention is shown. Voltage supply input signal line 16 is electrically connected to one end of a resistor 22, wherein the opposite end of resistor 22 is electrically connected to voltage supply signal path 20. At least a portion of the body of resistor 22 (i.e., at least a portion of the "active" region) of resistor 22 forms an emitter 26 of a PNP transistor 24. A base 28 of transistor 24 is left floating (unconnected) and a collector 30 of transistor 24 is electrically connected to signal path 21.

Figure 4:
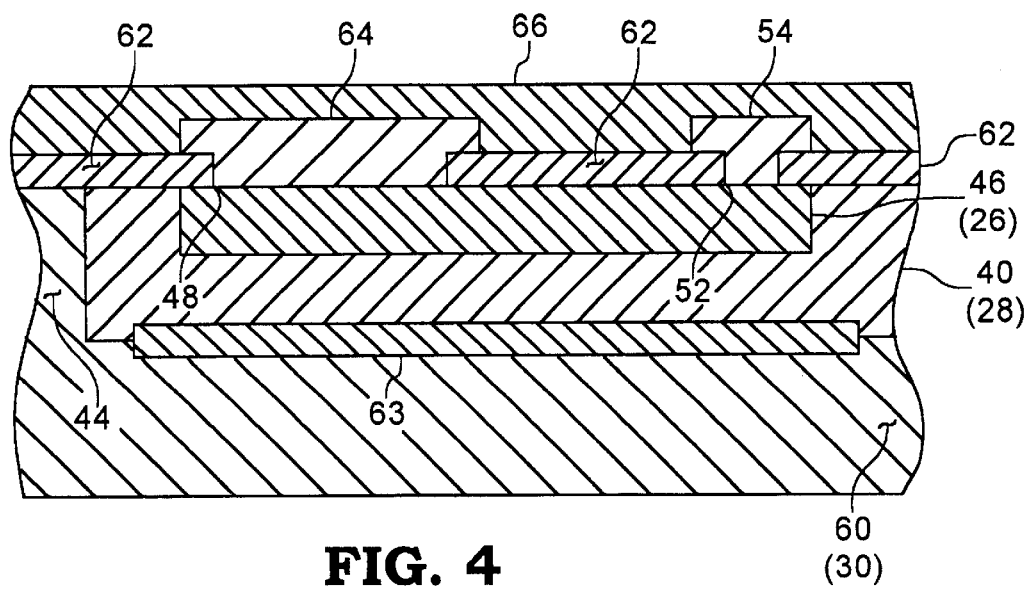
FIG. 4 is a cross-sectional view along section lines 4—4 of FIG. 3, illustrating some of the structural layers of the transient protection circuitry of FIGS. 2 and 3.
Figure 3:
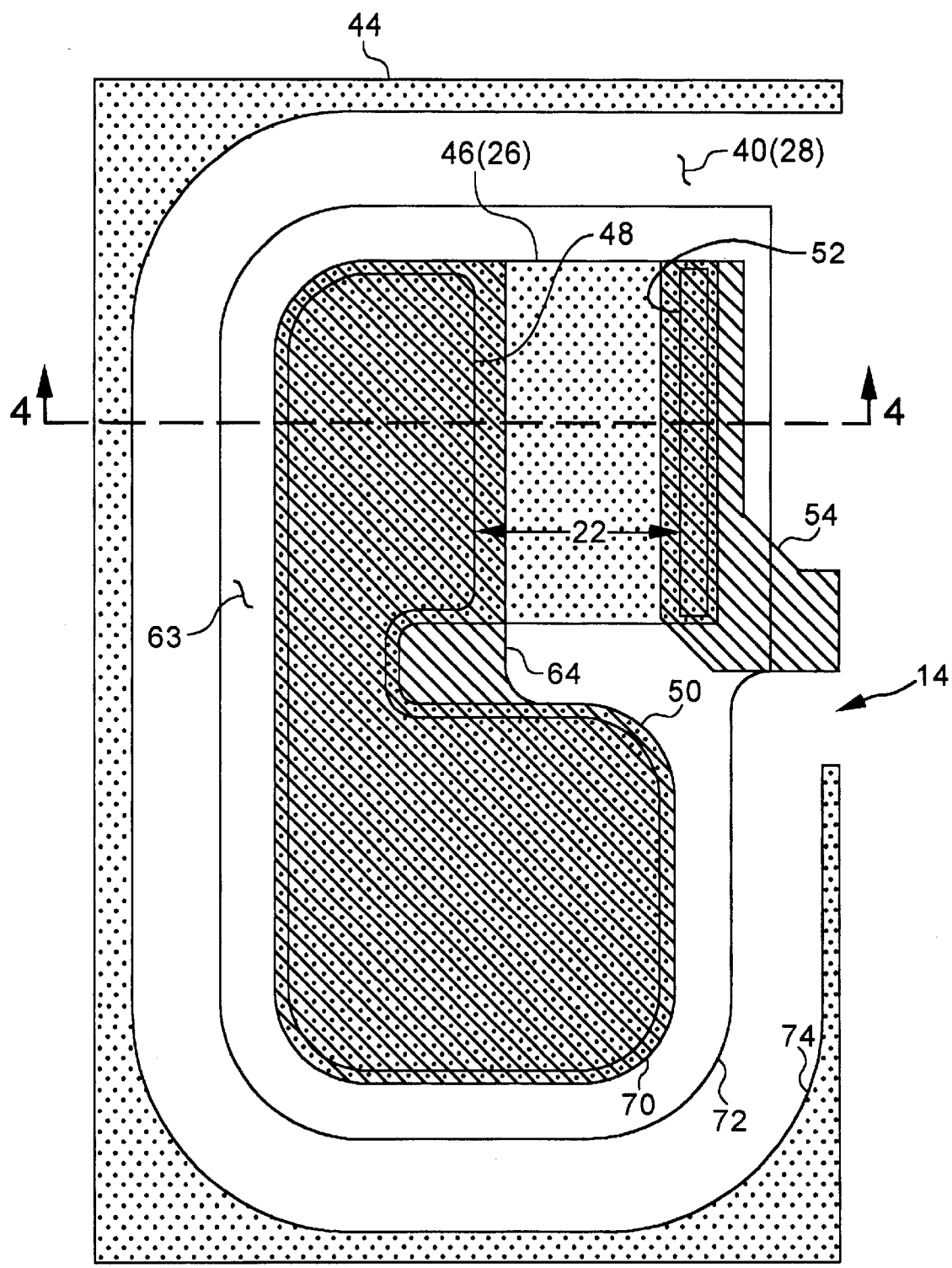
FIG. 3 is a top-plan view of one preferred layout of the transient protection circuitry of FIG. 2, in accordance with the present invention.

Referring now to FIGS. 3 and 4, one preferred embodiment of a device-level layout of the transient protection circuitry 14 of FIGS. 1 and 2, in accordance with the present invention, is shown. FIG. 3 is a top-plan view of a preferred integrated circuit layout of circuitry 14, and FIG. 4 is a cross-sectional view along section line 4—4 of FIG. 3, illustrating the various layers thereof. Preferably, the semiconductor layers illustrated in FIGS. 3 and 4 are formed of silicon (Si), although the present invention contemplates utilizing other known semiconductor materials in the construction of circuit 14. In any case, the transient protection circuitry 14 starts with a P-type semiconductor substrate 60 that forms the collector 30 of transistor 24. A N+-type buried semiconductor layer 63 is selectively diffused or otherwise implanted into substrate 60. A N-type epitaxial semiconductor layer 40 is then grown or otherwise formed on the substrate 60, and a P-type isolation region 44 is selectively diffused or otherwise implanted into the N-type epitaxial layer, wherein the isolation region 44 extends into the substrate 60 to form a N-type well 40 that defines the base 28 of transistor 24.

A P-type semiconductor layer 46 is diffused or otherwise implanted into the N-type well 40, wherein the resulting P-type well 46 forms the emitter 26 of transistor 24 as well as the resistor 22. Preferably, as most clearly shown in FIG. 3, the P-type region 46 defines an integrated circuit bond pad 50 which merges with resistor 22. A contact 48 is defined through an insulation layer 62 (e.g., SiO$_2$) that is typically formed during the semiconductor fabrication process, wherein the contact region 48 preferably extends over a majority of the area of bond pad 50 and toward the resistor 22 as shown in FIG. 3. A second contact 52 is formed through insulation layer 62, wherein the P-type region 46 extending between contact area 48 and contact area 52 defines the resistor 22 as shown in FIG. 3. A metal layer 64 (e.g., aluminium composition) is formed over the first contact area 48 and defines an electrical connection to signal path 16 (FIG. 2). Metal layer 64 preferably covers the entire bond pad 50 whereby a suitable interconnect from signal path 16 may be made to bond pad 50 in accordance with known techniques. For example, signal path 16 may be electrically connected to metal layer 64 via a known wire bonding technique wherein such a wire bond process uses thermal and/or ultrasonic energy to attach a small diameter gold or aluminium wire to bond pad 50. An opposite end of the gold or aluminium wire is attached to a lead frame (not shown) in accordance with a known techniques, whereby a corresponding lead defines signal path 16. Alternatively, electrical connection to bond pad 50 may be made in accordance with known tape-automated-bonding (TAB) process, solder bump or other known electrical connection technique.

Another metal region 54 is formed over contact 52 to define signal path 20 wherein metal layer 54 correspondingly defines a voltage supply input to the application circuitry 18. A final passivation layer 66 (typically Si$_3$N$_4$, SiO$_2$ or the like) is formed over the entire integrated circuit 10 to provide for mechanical protection of the surface structure, wherein a contact region (not shown) is formed through passivation layer 66 in the vicinity of bond pad 50 to allow electrical connection thereto as just described and as is known in the art.

In the embodiment of transient protection circuitry 14 illustrated in FIGS. 3 and 4, the emitter 26 of the PNP transistor 24 is distributed across the resistor 22. This "merged" device protects the application circuitry 18 from transient and other fault-related conditions generated by voltage supply 12. For example, during a high voltage ESD or coil secondary discharge event of either polarity, the transistor 24 will avalanche and thereby limit the voltage to which application circuitry 18 is subjected. Transistor 24 accomplishes this by having a sufficiently low series resistance to the substrate 60 as compared to the output impedance of the source of the high voltage discharge. Transistor 24 is designed, as shown in FIGS. 3 and 4, to have a low series resistance to the substrate 60 by making the total area of transistor 24 sufficiently large and by the formation of a N+-type buried layer 63 positioned under the P-type layer 46 (and preferably extending slightly beyond layer 46). Thus, while the high voltage transient due to ESD or coil secondary discharge event may be thousands of volts, the avalanched condition of the transistor 24 will limit the voltage reaching application circuitry 18 to preferably less than 100 volts. The resistor 22 acts to further limit the magnitude of the current that can flow to the application circuitry 18 during the high voltage event.

During a load dump event, the voltage on signal path 16 can, in one embodiment, reach peak values of 80 volts. The source of a load dump transient typically has a low output impedance so it is not practical to design the transient protection circuitry 14 to limit or clamp this voltage from such a low output impedance. Accordingly, it is necessary in the present embodiment to design the transient protection circuitry 14 such that the transistor 24 has an avalanche voltage that is greater than the peak value (e.g., 80 volts) of the load dump event. As long as the avalanche voltage of transistor 24 is larger than the peak voltage value of the load dump event, no current will flow through transistor 24 during a load dump event and transistor 24 will therefore not be damaged. In this scenario, the series resistor 22 acts to limit the current flow to the application circuitry 18 to a sufficiently low value to prevent damage to any areas of circuitry 18.

During a reverse battery condition, signal line 16 of voltage supply 12 is connected to signal line 21 of transient protection circuitry 14, and signal line 15 of voltage supply 12 is connected to signal line 16 of the transient protection circuitry 14. As long as the transistor 24 has an avalanche voltage in the reverse direction that is greater than the voltage supply voltage, no current will flow through transistor 24 during a reverse battery condition and the series resistor 22 again will limit the current flow to the application circuitry 18 to prevent any damage thereto.

From the foregoing, it should now be apparent that the transistor 24 of the transient protection circuitry 14 of the present invention must have a forward or positive avalanche voltage that is greater than the peak voltage of a load dump event, and must also have a reverse avalanche voltage that is greater than a maximum output voltage of the voltage supply 12. Moreover, as described with respect to a ESD or coil secondary discharge event, the transistor 24 must have a sufficiently low series resistance when avalanched to limit the voltages due to these events. The large size required to achieve such a low series resistance is a serious drawback in integrated circuit area usage, and undesirably increases the cost of the overall integrated circuit. The present invention addresses this problem by designing the emitter 26 of the transistor 24 so that most of its area can also be used as the bond pad 50 for the interconnect to signal path 16 as described above. Since the bond pad 50 must be present to make the connection to signal path 16 in any case, merging the emitter 26 of the transistor 24 into the bond pad 50 will significantly reduce and possibly eliminate the additional cost associated with the transient protection circuitry 14.

Referring again specifically to FIG. 3, the bond pad 50 is typically configured roughly square in geometry to minimize the area used on the integrated circuit 10, thereby minimizing the area cost of the overall integrated circuit 10. This design goal necessitates forming the emitter 26 of transistor 24 with a roughly square geometry. This approach has at least one serious drawback in that the electric field resulting from a square geometry emitter 26 will be concentrated at the corners of the bond pad 50.

Typical prior art bond pad implementations utilize concentric radii to form the bond pad corners. While the use of such concentric radii will maintain a constant distance between each portion of the outer periphery of the P-type region 46 and its surrounding structure, the magnitude of the electric field in the vicinity of bond pad 50 will still be larger in the corners than along the straight parallel sides of bond pad 50. The concentration of electric field in the corners of bond pad 50 is undesirable due to the tendency to concentrate current in these corners whenever the transistor 24 is conducting current during a high voltage transient event. Such current concentration in the corners of bond pad 50 during a high voltage transient event can result in damage to the transistor 24.

In accordance with the present invention, the concentration of current in the corners of bond pad 50 is alleviated by altering the radii and respective centers of the corners 70 of the bond pad 50 relative to the corners 72 and 74 of the N+buried layer 63 and N-type well 40 respectively. Preferably, the radii and their respective centers of corners 70, 72 and 74 are configured so that the resulting electric field is reduced in these corners. Additionally, each of the corners (e.g. 70) of P-type region 46 about the periphery of bond pad 50 and adjacent to resistor 22 are further drawn inwardly toward contact 48 and hence made non-concentric so that the electric fields in the corners 70 of P-type region 46 are substantially equal to the electric fields along the linear edges of P-type region 46. Advantageously, the resulting electric field about the outer periphery of P-type region 46 (and bond pad 50 in particular) will have substantially constant magnitude there about, thus minimizing the possibility of concentrated damage to P-type region 46 in the vicinity of corners 70 during a high voltage transient event.

Figure 5:
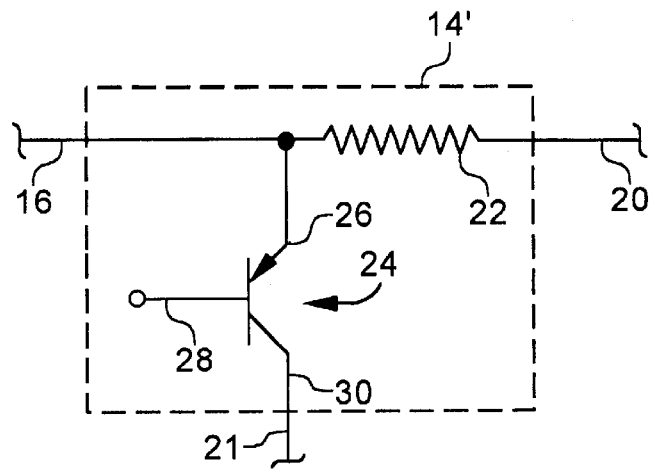
FIG. 5 is a device-level schematic of an alternate embodiment of the transient protection circuitry of FIG. 1.
Figure 6:
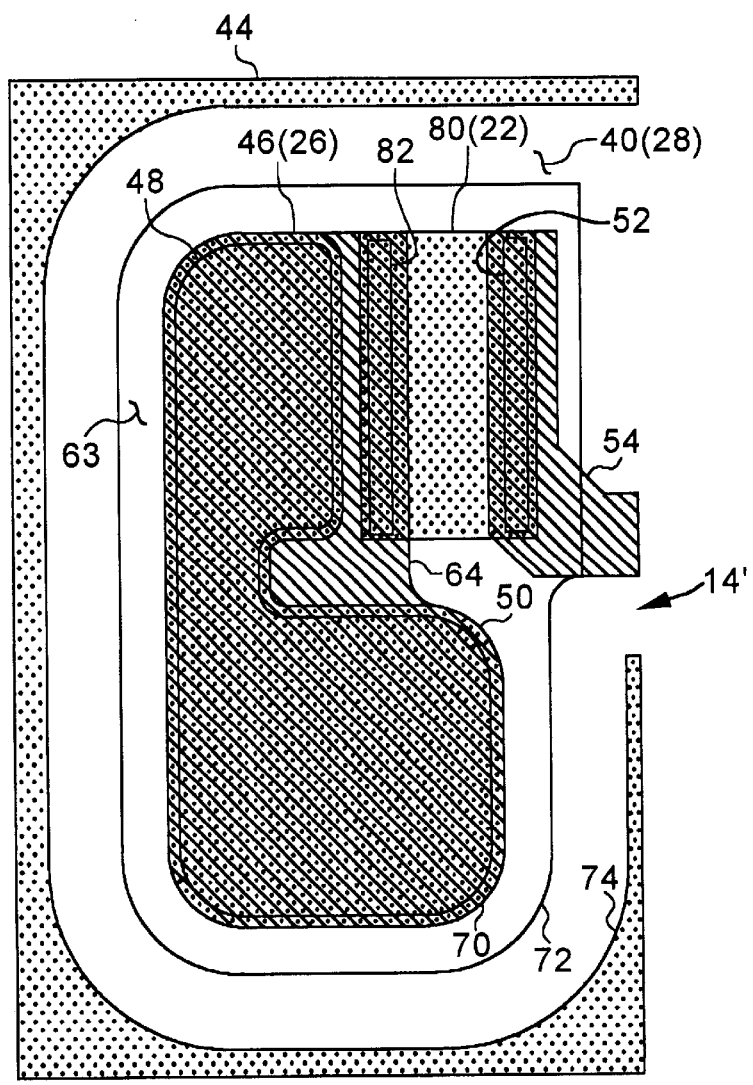
FIG. 6 is a top-plan view of one preferred layout of the transient protection circuitry of FIG. 5.

Referring now to FIG. 5, a device-level schematic of an alternate embodiment 14' of the transient protection circuitry 14 of FIG. 1, in accordance with the present invention, is shown. Transient protection circuitry 14' is identical in every respect to the transient protection circuitry 14 of FIG. 2 except that the emitter 26 of transistor 24 is no longer "integral with resistor 22, but is rather electrically connected to the first end of resistor 22 (i.e., signal path 16). Referring to FIG. 6, an integrated circuit layout of the transient protection circuitry 14' of FIG. 5 is shown. FIG. 6 is identical in most respects to the integrated circuit layout of the transient protection circuitry 14 of FIG. 3 except that the P-type well 46 of FIG. 3 is broken up into two separate P-type wells 46 and 80, wherein P-type well 46 defines the emitter 26 of transistor 24 and the P-type well 80 defines the resistor 22. The P-type well 80 defines a contact 52 therein identical to the contact 52 of FIG. 3, and further defines a second contact 82, wherein the resistor 22 is defined between contacts 52 and 82. The metal layer 64 is in contact with both of the P-type wells 46 and 80 through contacts 48 and 82 respectively.

Those skilled in the art will recognize that the alternate embodiment of the transient protection circuitry 14', as illustrated in FIGS. 5 and 6, achieve all of the goals and benefits of the transient protection circuitry 14 illustrated in FIGS. 2–4 with no additional process steps. With all other such design considerations satisfied, the transient protection circuitry 14' may accordingly be substituted for the transient protection circuitry 14 of FIGS. 2–4.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A transient protection circuit comprising:
    a resistor having a first end adapted for connection to a first signal line of a voltage source and a second opposite end adapted for connection to a voltage supply input of an application circuit; and
    a bipolar transistor having an emitter connected to said first end of said resistor, a floating base, and a collector adapted for connection to a second signal line of said voltage supply.

2. The transient protection circuit of claim 1 wherein said emitter of said bipolar transistor defines at least a portion of an active area of said resistor.

3. The transient protection circuit of claim 1 wherein said first signal line of said voltage source is one of a voltage signal line and a signal return line and said second signal line of said voltage source is the other of a voltage signal line and a signal return line.

4. The transient protection circuit of claim 3 wherein said signal return line is connected to ground potential.

5. A transient protection circuit comprising:
    a P-type semiconductor substrate adapted for connection to a first signal line of a voltage source;
    a floating N-type semiconductor well extending from said substrate;
    a P-type semiconductor well disposed within said N-type well, said P-type semiconductor well, said N-type semiconductor well and said P-type substrate defining a bipolar transistor;
    a first electrical contact to said P-type semiconductor well adapted for connection to a second signal line of a voltage source; and
    a second electrical contact to said P-type semiconductor well adapted for connection to a voltage supply input of an application circuit, said P-type semiconductor well defining a resistor between said first and second electrical contacts.

6. The transient protection circuit of claim 5 wherein said second signal line is one of a voltage signal line and a signal return line of said voltage source, and said first signal line is the other of a voltage signal line and a signal return line of said voltage source.

7. The transient protection circuit of claim 6 wherein said signal return line of said voltage source is connected to ground potential.

8. The transient protection circuit of claim 6 wherein said voltage source is a vehicle battery.

9. The transient protection circuit of claim 5 wherein said transient protection circuit and said application circuit are formed on a common monolithic integrated circuit.

10. The transient protection circuit of claim 5 wherein at least a portion of said first electrical contact defines an integrated circuit bond pad.

11. The transient protection circuit of claim 5 wherein said P-type well defines an outer periphery including linear boundaries and curved boundaries;
    and where said curved boundaries about said first electrical contact are configured to substantially equalize an electric field about the outer periphery of said first electrical contact.

12. The transient protection circuit of claim 5 wherein said bipolar transistor has an avalanche voltage associated therewith that is greater than a load dump transient threshold voltage.

13. The transient protection circuit of claim 8 wherein said bipolar transistor has a reverse avalanche voltage associated therewith that is greater than a reverse battery voltage.

14. The transient protection circuit of claim 5 further including a N+-type buried layer disposed between said N-type well and said P-type substrate.

15. The transient protection circuit of claim 14 wherein said P-type well and said N+-type buried layer are sized to minimize a series resistance of said bipolar transistor.

16. A transient protection circuit comprising:
   a P-type semiconductor substrate adapted for connection to a first signal line of a voltage source;
   a N-type semiconductor well extending from said substrate;
   a first P-type semiconductor well disposed within said N-type well, said first P-type semiconductor well, said N-type semiconductor well and said P-type substrate defining a bipolar transistor, said P-type semiconductor well defining a first electrical contact thereto; and
   a second P-type semiconductor well disposed within said N-type well, said second P-type semiconductor well defining second and third electrical contacts thereto and a resistor therebetween;
   wherein said first and second electrical contacts are adapted for connection to a second signal line of said voltage source, and said third electrical contact is adapted for connection to a voltage supply input of an application circuit.

17. The transient protection circuit of claim 16 wherein said transient protection circuit and said application circuit are formed on a common monolithic integrated circuit.

18. The transient protection circuit of claim 16 wherein at least a portion of said first electrical contact defines an integrated circuit bond pad.

19. The transient protection circuit of claim 16 further including a N+-type buried layer disposed between said N-type well and said P-type substrate.

20. The transient protection circuit of claim 19 wherein said first P-type well and said N+-type buried layer are sized to minimize a series resistance of said bipolar transistor.

* * * * *